United States Patent
Korson et al.

(10) Patent No.: US 6,909,301 B2
(45) Date of Patent: Jun. 21, 2005

(54) OSCILLATION BASED ACCESS TIME MEASUREMENT

(75) Inventors: Steven P. Korson, Bruckberg (DE);
Brian D. Borchers, Wylie, TX (US);
Bryan Sheffield, Rowlett, TX (US);
Clive Bittlestone, Lucas, TX (US);
Doug Counce, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 185 days.

(21) Appl. No.: 10/236,328

(22) Filed: Sep. 6, 2002

(65) Prior Publication Data

US 2004/0049711 A1 Mar. 11, 2004

(51) Int. Cl.[7] .................................................. G01R 31/02
(52) U.S. Cl. ..................... 324/763; 324/158.1
(58) Field of Search ................................ 324/763, 765, 324/158.1; 702/75, 79, 117, 118, 124–125, 189; 368/13, 118, 120, 113; 331/57

(56) References Cited

U.S. PATENT DOCUMENTS

| | | | | | |
|---|---|---|---|---|---|
| 5,625,288 A | * | 4/1997 | Snyder et al. | ........... | 324/158.1 |
| 5,790,479 A | * | 8/1998 | Conn | ........................ | 368/118 |
| 6,069,849 A | * | 5/2000 | Kingsley et al. | ............ | 368/113 |
| 6,219,305 B1 | * | 4/2001 | Patrie et al. | ................ | 368/113 |
| 6,597,753 B1 | * | 7/2003 | Okayasu et al. | ............ | 375/373 |

* cited by examiner

Primary Examiner—Vinh Nguyen
Assistant Examiner—Russell M. Kobert
(74) Attorney, Agent, or Firm—Rose Alyssa Keagy; W. James Brady, III; Frederick J. Telecky, Jr.

(57) ABSTRACT

An embodiment of the invention is a method for measuring access time where the frequency of a ring oscillator is measured with and without a device under test 1 in the ring. Those two frequencies are compared to calculate the access time of the device under test 1. Another embodiment of the invention is circuitry 25 that measures the frequency of a ring oscillator with and without a device under test 1. Again the two frequencies are compared to calculate the access time of the device under test 1.

3 Claims, 2 Drawing Sheets

OSCILLATION BASED ACCESS TIME MEASUREMENT

CROSS-REFERENCE TO RELATED APPLICATIONS

This application is related to application Ser. No. 10/236,329 filed on the same date as this application and entitled "Oscillation Based Cycle Time Measurement". With its mention in this section, this patent application is not admitted to be prior art with respect to the present invention.

BACKGROUND OF THE INVENTION

This invention relates to the measurement of device access time using oscillation based sequential element characterization.

DETAILED DESCRIPTION OF THE INVENTION

Access time is the measurement from the clock input to the output ("Q") of the same device. Several aspects of the invention are described below with reference to example applications for illustration. It should be understood that numerous specific details, relationships, and methods are set forth to provide a fall understanding of the invention. One skilled in the relevant art, however, will readily recognize that the invention can be practiced without one or more of the specific details or with other methods. In other instances, well-known structures or operations are not shown in detail to avoid obscuring the invention.

In the best mode application, an on-chip measurement ("OCM") oscillation circuit performs both the access time measurement and the cycle time measurement of a device under test ("DUT") such as a memory device. The measurement of a device's access time using oscillation based sequential element characterization is described herein.

A device's "access time" is the measurement from the clock input to the output of the DUT. This is time measured by oscillating the OCM circuit with the memory in the oscillation path and again without the memory in the oscillation path and then calculating the difference in oscillation time.

Figure 1:
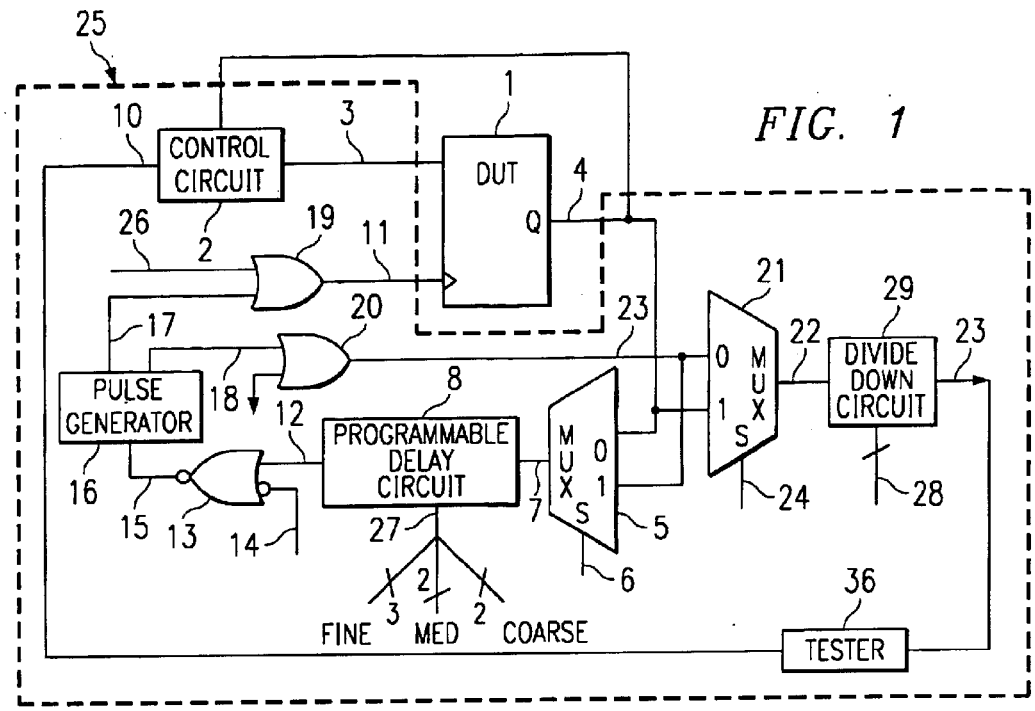
FIG. 1 shows the best mode OCM circuit.

Referring to the drawings, FIG. 1 depicts a best mode OCM circuit 25 for performing the access time measurement. With the DUT 1 in the oscillation path the OCM circuit oscillates when the output of the DUT changes at every clock cycle. Non-write through devices being tested will oscillate only in read-read mode. Write through devices being tested also oscillate in write-write and write-read modes.

In the best mode application, there is a set-up procedure that occurs before the measurement is performed. It is within the scope of this invention to modify the following set-up procedure as appropriate. For example, an inverted data bit matched by a corresponding change in the control logic is still comprehended by this invention.

The access time measurement operation for read-read mode will be described first. In the best mode application, address bits A0 and A1, data bit D0, and output bit Q0 are used. However the use of any two address bits, any data bit, and any corresponding output bit are also within the scope of this invention.

The operation of the OCM in read-read mode is described first. Here the example DUT 1 is a synchronous memory device. Because the OCM circuit is in read-read mode every cycle is a read operation.

In the best mode application, the first frequency measurement is with the OCM circuit oscillating with the synchronous memory 1 in the oscillation path. This is accomplished by setting the multiplexer control input bit 6 to a logic "0" level.

A tester 36 is used to provide address input signals and data input signals on line 10 to the control circuit, 2. The control circuit 2 drives the non-clock inputs to the memory 1 through line 3. The purpose of control circuitry 2 is to force an address bit for the next cycle to be the inverse of the current cycle during testing. By using the control circuit 2 to pre-load address 0 with a logic "0" and the second address with a logic "1" every cycle will read from the opposite address causing a change on the output 4 of memory 1. The result is that when the memory us clocked it produces a change in the memory output 4 on every cycle.

The output 4 of the memory is connected to the 0 input bit of the multiplexer 5. As noted above, the multiplexer control input bit 6 is initially set to a logic "0" level, therefore the signal on memory output 4 is passed through, on line 7, to a programmable delay circuit, 8.

The programmable delay circuit 8 ensures that the feedback loop from the memory output 4 to the address/data/control memory inputs 3 will not have any setup violations with respect to the clock pulse on line 11. The programmable feature provides three types of adjustments: course, medium, and fine. In the best mode application, the programmable delay circuit 8 is set for maximum delay on line 27 during access time measurement-ensuring that the delay path of the oscillator is long enough for the memory to operate properly.

The output signal 12 of programmable delay circuit 8 is one of two inputs to NOR gate 13. The other input, 14, to NOR gate 13 is initially at a logic "0" level until the start of the test; thereby holding all of the signals in the loop—15, 18, 7, and 12—at the same logic level. The inverting nature of gate 13 is what changes signal 15 to the inverse of signal 12 when signal 14 is set to logic level "1", initiating the ring oscillator and the test.

Circuitry (not shown) added to the OCM ensures that the pulse generator is disabled when the OCM is not running. During access time measurement testing, the pulse generator is enabled and a change in signal level on line 15 causes the pulse generator 16 to generate a clock pulse on line 17. This clock pulse travels on line 17 to the OR gate 19, thereby sending a clock pulse on line 11 to memory 1. (Line 26 is used by the tester to control the clock input of memory 1 during other tests; however, the tester holds this input at logic "0" when the OCM is being used.)

By the time this new clock pulse reaches the memory on line 11, the new memory address has already been set to the opposite value, thereby forcing another change on the output. As described above, this change on the output causes the pulse generator to again send another clock pulse to the memory which has in the mean time changed it's address back to the original value. This cycle of events repeats, creating the oscillation ring.

The oscillation of memory output 4 is measured by setting the control bit 24 of multiplexer 21 to a logic level "1". This passes the memory output signal 4 through a divide down circuit 29 (described later) to the tester on line 23 to be measured. This first oscillation frequency (with the DUT in the oscillation path) is considered the reference oscillation frequency.

Figure 2:
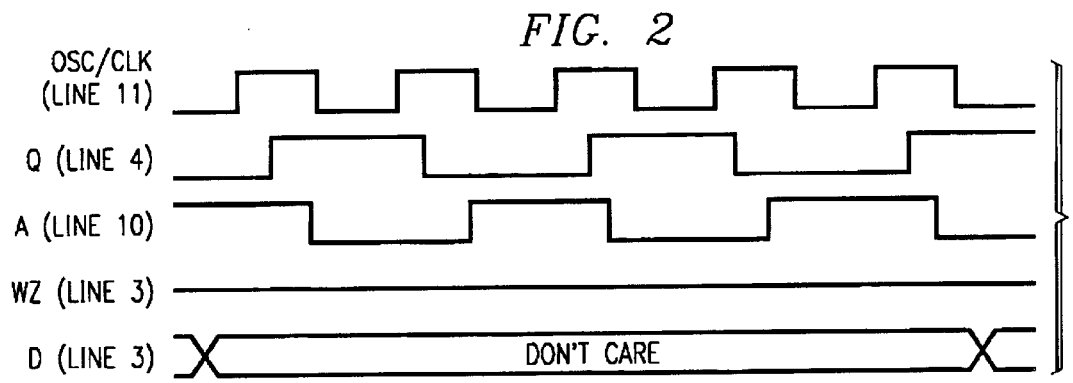
FIG. 2 shows OCM waveforms for read-read mode.

FIG. 2 shows OCM waveforms for selected pins during the read-read mode access time measurement. The write enable ("WZ") input on line 3 is held high during read-read mode operation and the data input on line 3 is in a 'Don't Care' state during read-read mode. Note that both the address and the output toggle at one half the clock rate.

Once the reference oscillation frequency has been obtained, the next step in the best mode application is to change the OCM to oscillate without the memory 1. Now the free-running circuit oscillation frequency is calculated. For this measurement the pulse generator 16 mimics the toggling DUT by changing its output signal level on line 18 when the input level changes. Here, the output signal 18 from the pulse generator 16 is passed through an OR gate 20 in order to equalize the signal paths; therefore matching the delay created by OR gate 19 in the previous measurement.

The control bit 24 of multiplexer 21 is now set at a logic "0" level and the oscillation signal (now without the DUT in the oscillation path) is sent to the divide down circuit 29 on line 22. After the output signal's frequency has been reduced by the divide down circuit 29 the output signal is sent to the tester on line 23. It should be noted that it is within the scope of this invention to send the output signal to the tester directly from the multiplexer 21 on line 22 (without processing the output signal through a divide down circuit).

Figure 3:
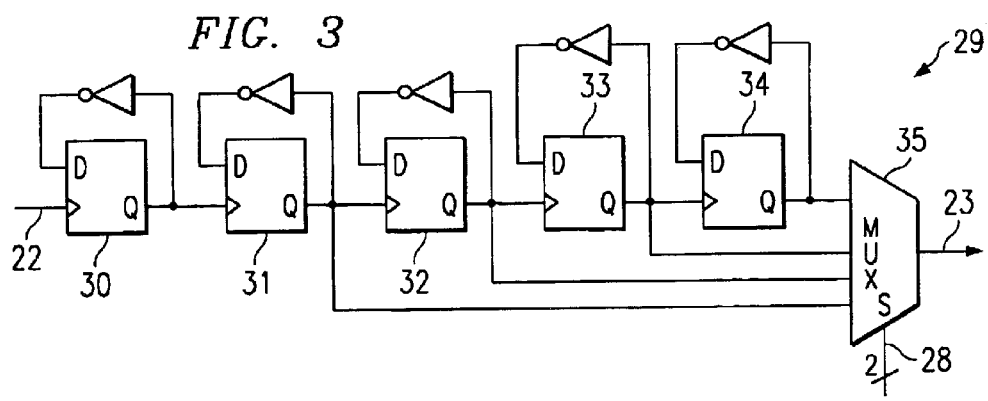
FIG. 3 shows the best mode divide down circuit.

Referring again to the drawings, FIG. 3 shows the best mode divide down circuit 29. This divide down circuit 29 is capable of manipulating an input oscillation signal so that the output is a "power-of-two" division of its input frequency. The selection of the division magnitude is accomplished through one or more select lines 28 that are driven by the tester. The divide down circuit 29 contains multiple D flip-flops 30–34 that can be activated as desired by multiplexer 35 in response to an input signal on select line(s) 28. As an example, the divide down circuit will take the signal received on line 22 and divide it by 32 so that the signal is at a slower speed that the average tester can process without additional expensive circuitry. Without this divide down circuitry, either A) expensive test circuitry will be needed to process the high-speed signals created by the high speed DUT operating at the rated speeds, or B) the DUT will have to be operated at a speed far below its rated operating speed during device test, preventing the calculation of the minimum cycle time.

The second (free-running circuit) frequency is subtracted from the reference frequency to calculate the access time of the DUT. For example the reference frequency (after taking into account the divide down circuit) might be 102 MHz and the free-running frequency 120 MHz. Converting those frequencies to time periods (i.e. calculating the inverse of the frequency values) results in 9.8 ηs and 8.33 ηs respectively. These have to be divided by 2 again since there are 2 accesses per period, so $T_{access}=(9.8/2)-(8.33/2)=0.73$ ηs.

Figure 4:
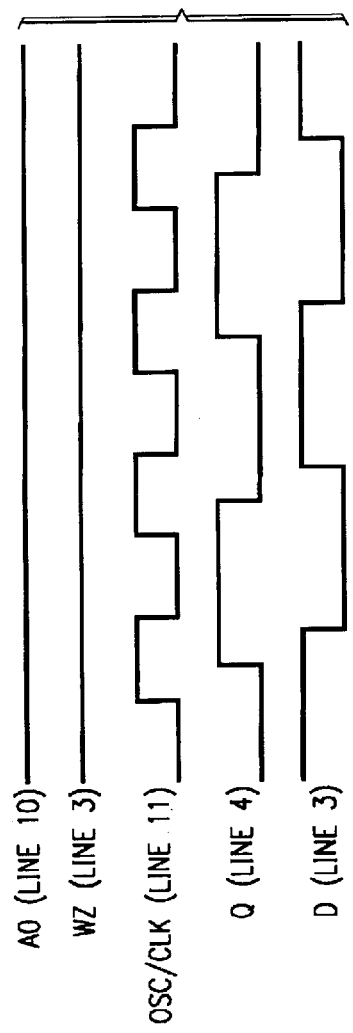
FIG. 4 shows OCM waveforms for write-write mode.

FIG. 4 shows selected OCM waveforms for the access time measurement operation performed in write-write mode. As an example, this test would be used in situations where the DUT is a memory with write-through capability. When testing such devices, the OCM can also be operated in write-write mode. This operation will be very similar to the read-read operation previously described. However, in write-write mode the same address (e.g. A0) is always used. Furthermore, the data written to memory 1 on line 3 is always the inverse of the memory output ("Q"). Note that WZ is held at a logic "0" level (active). Also note that the data and output signals toggle at one half the clock rate.

Figure 5:
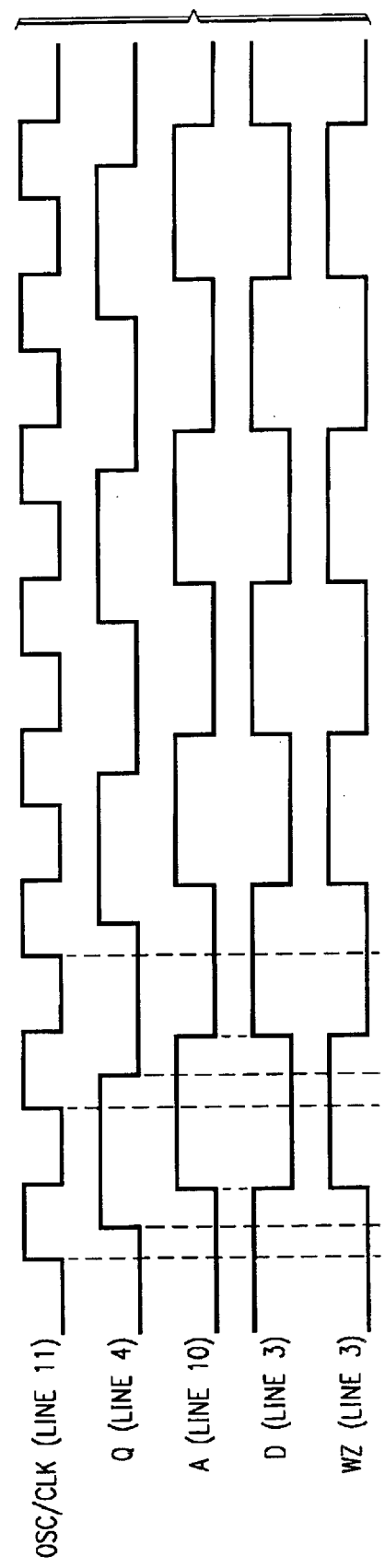
FIG. 5 shows OCM waveforms for write-read mode.

FIG. 5 shows selected OCM waveforms for the access time measurement operation performed in write-read mode. As an example, this test would be used in situations where the DUT is a memory with write-through capability. In write-read mode, the cycles alternate between writing and reading and the final frequency is a combination of the two. This operation will also be very similar to the read-read operation previously described. The difference is that both the address bit used and the WZ bit follow the output ("Q"). The memory is preloaded with a logic level "1" in the first address (i.e. A[0]) and a logic level "0" in the second address being used (i.e. A[1]). Writing the 1 at the first address will set everything up to read from the other address on the next pulse. The result is that the OCM circuit will always write to the first address and read from the second address. The data being written will always by the inverse of Q, so the data being written at the first address will always be a logic "1".

Various modifications to the invention as described above are within the scope of the claimed invention. As an example, instead of the pulse generator device described above, a custom pulse generator could be used having balanced pulse and level output paths. The frequency measurements could be analyzed through the use of an oscilloscope instead of a tester. In addition, the functions comprehended by the invention could be accomplished in various technologies such as CMOS or TTL. Moreover, it is within the scope of this invention to exercise any or all address, data, and output pins during access time measurement testing.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for measuring access time comprising:
   determining the frequency of a ring oscillator containing a device under test;
   determining the frequency of a similar ring oscillator which doesn't contain said device under test; and
   calculating access time of said device under test by comparing said frequencies.

2. The method of claim 1, wherein said comparing is performed at the output of a frequency divider circuit coupled to said ring oscillator.

3. A method for measuring access time comprising:
   determining the frequency of a ring oscillator containing a device under test, said ring oscillator including a frequency divider circuit;
   determining the frequency of a similar ring oscillator which doesn't contain said device under test, said ring oscillator containing said a frequency divider circuit; and
   calculating access time of said device under test by comparing said frequencies at the outputs of said frequency divider circuits.

* * * * *